United States Patent [19]
Hama

[11] Patent Number: 5,301,146
[45] Date of Patent: Apr. 5, 1994

[54] MEMORY CELL OF SRAM USED IN ENVIRONMENTAL CONDITIONS OF HIGH-ENERGY PARTICLE IRRADIATION

[75] Inventor: Kaoru Hama, Yokohama, Japan

[73] Assignee: Kabushiki Kaisha Toshiba, Kawasaki, Japan

[21] Appl. No.: 757,273

[22] Filed: Sep. 10, 1991

[30] Foreign Application Priority Data

Sep. 11, 1990 [JP] Japan .................................. 2-238891

[51] Int. Cl.$^5$ ............................................. G11C 11/40
[52] U.S. Cl. ..................................... 365/154; 365/156; 365/190
[58] Field of Search ........................ 365/154, 156, 190

[56] References Cited

U.S. PATENT DOCUMENTS

| | | | |
|---|---|---|---|
| 4,725,981 | 2/1988 | Rutledge | 365/154 |
| 4,766,572 | 8/1988 | Kobayashi | 365/190 |
| 4,797,804 | 6/1989 | Rockett, Jr. | 365/154 |
| 4,956,814 | 9/1990 | Houston | 365/154 |

FOREIGN PATENT DOCUMENTS 0166260 7/1988 Japan .................................. 365/174

OTHER PUBLICATIONS

Kohler et al., "SEU Characterization of Hardened CMOS SRAMS Using Statistical Analysis of Feedback Delay In Memory Cells," IEEE Transactions On Nuclear Science, vol. 36, No. 6, pp. 2318–2322 (Dec. 1989).

Primary Examiner—Eugene R. LaRoche
Assistant Examiner—Son Dinh
Attorney, Agent, or Firm—Finnegan, Henderson, Farabow, Garrett & Dunner

[57] ABSTRACT

A memory cell of a static semiconductor memory device includes first and second inverters, first and second variable resistors and first and second transfer transistors. The first variable resistor is connected between an output terminal of the first inverter and an input terminal of the second inverter. The second variable resistor is connected between an output terminal of the second inverter and an input terminal of the first inverter. The first transfer transistor has a current path connected between the output terminal of the first inverter and a first bit line and a gate connected to a word line. The second transfer transistor has a current path connected between the output terminal of the second inverter and a second bit line and a gate connected to the word line. A control circuit controls the resistances of the first and second variable resistors, and the resistances of the first and second variable resistors are controlled to be reduced when a memory cell is selected in the write-in cycle and they are increased when the memory cell is not selected.

16 Claims, 6 Drawing Sheets

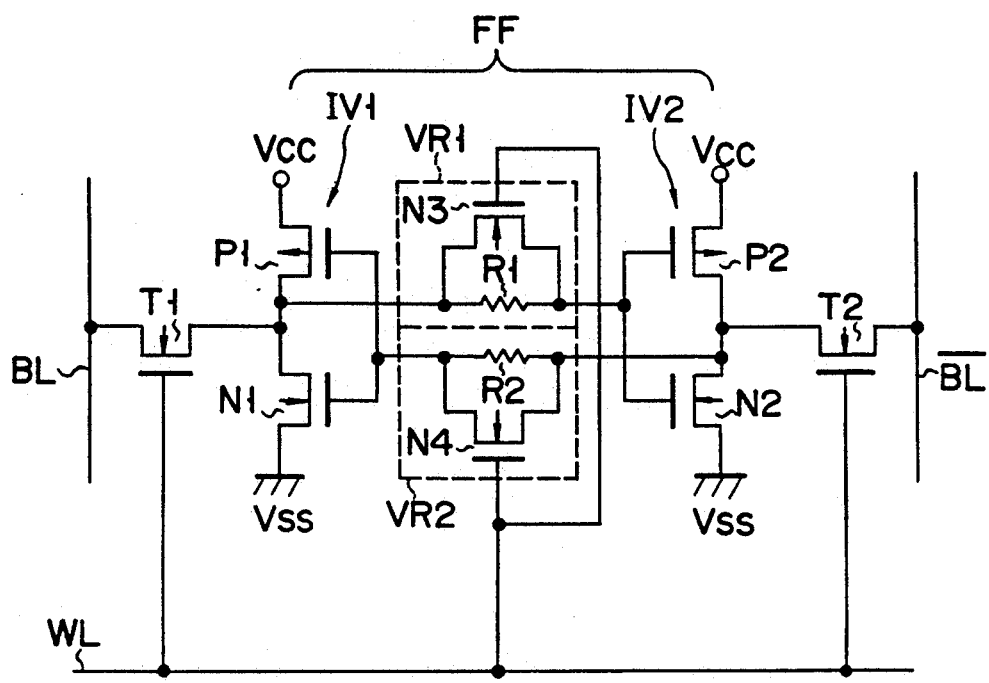
F I G. 7
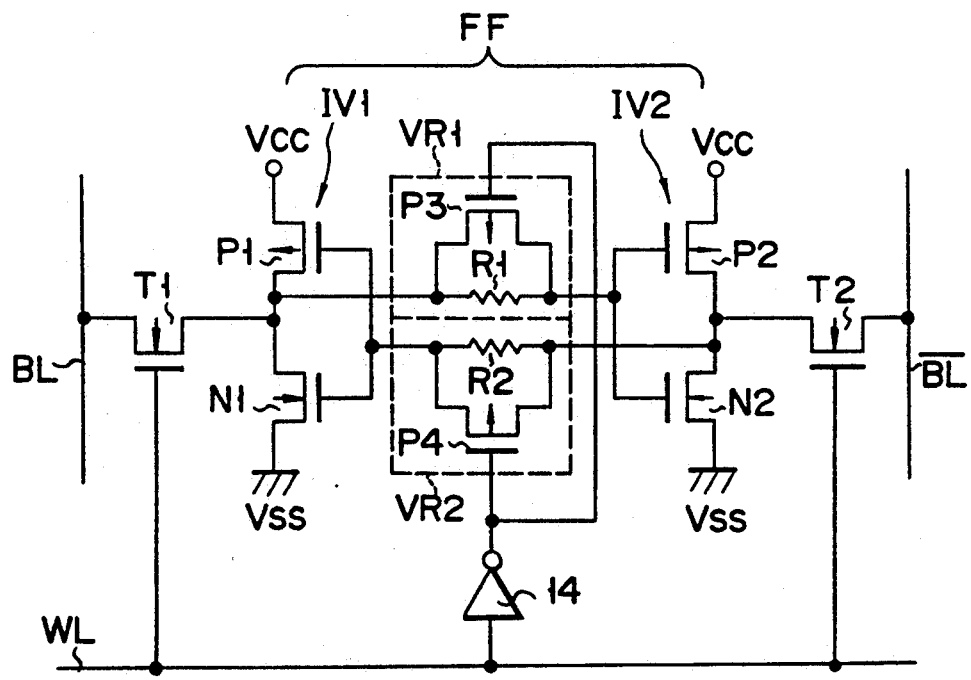
F I G. 8

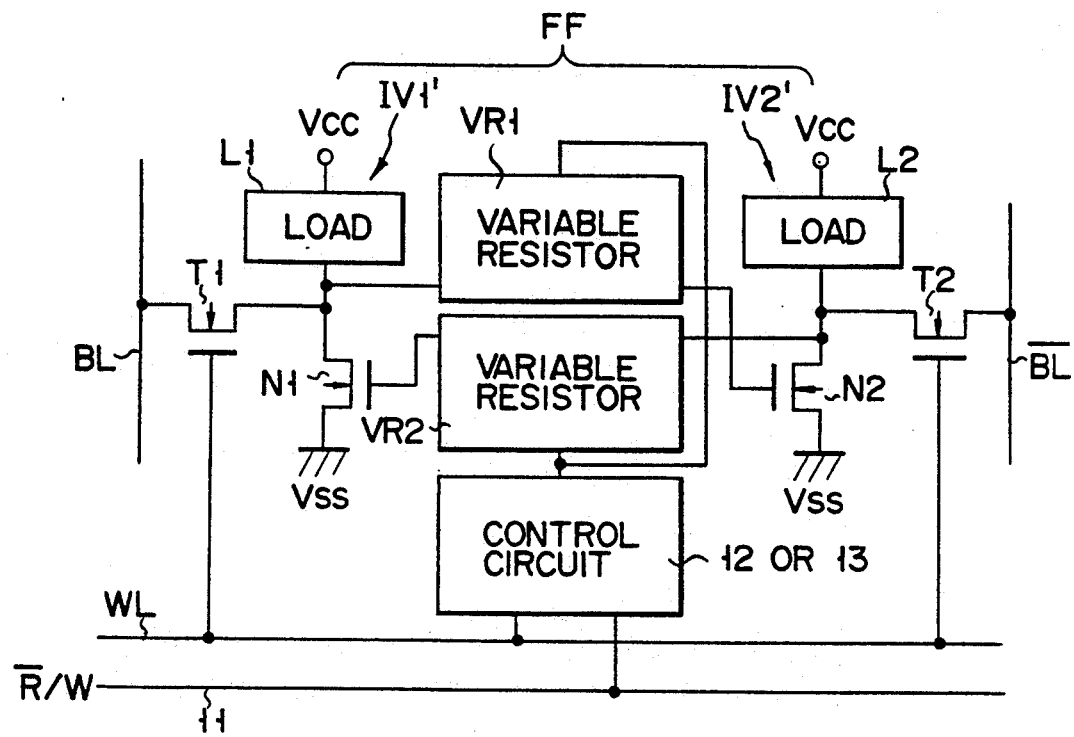
F I G. 9
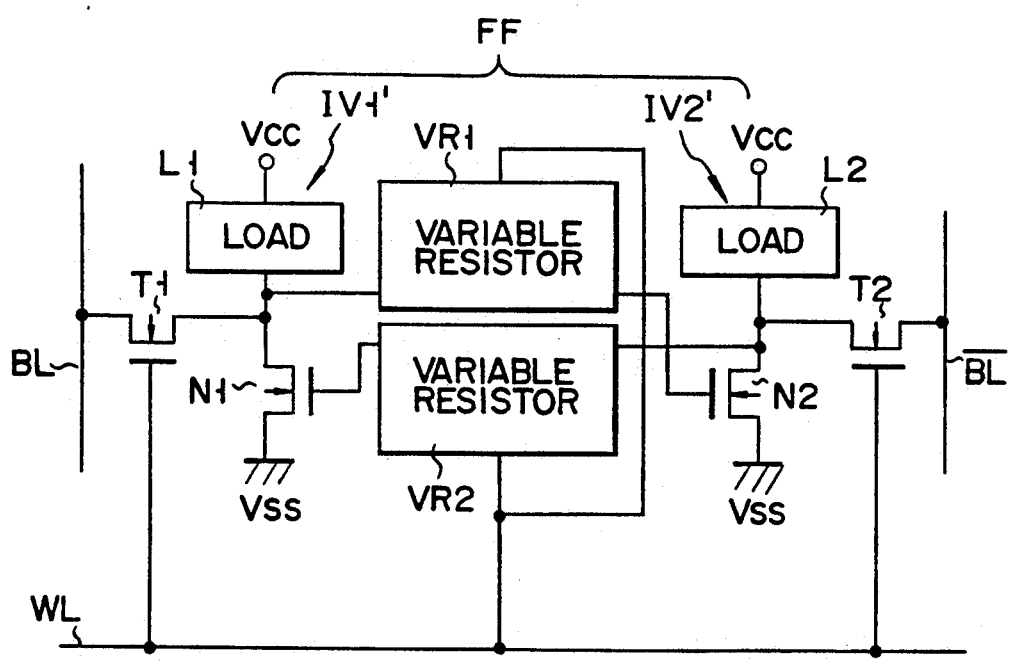
F I G. 10

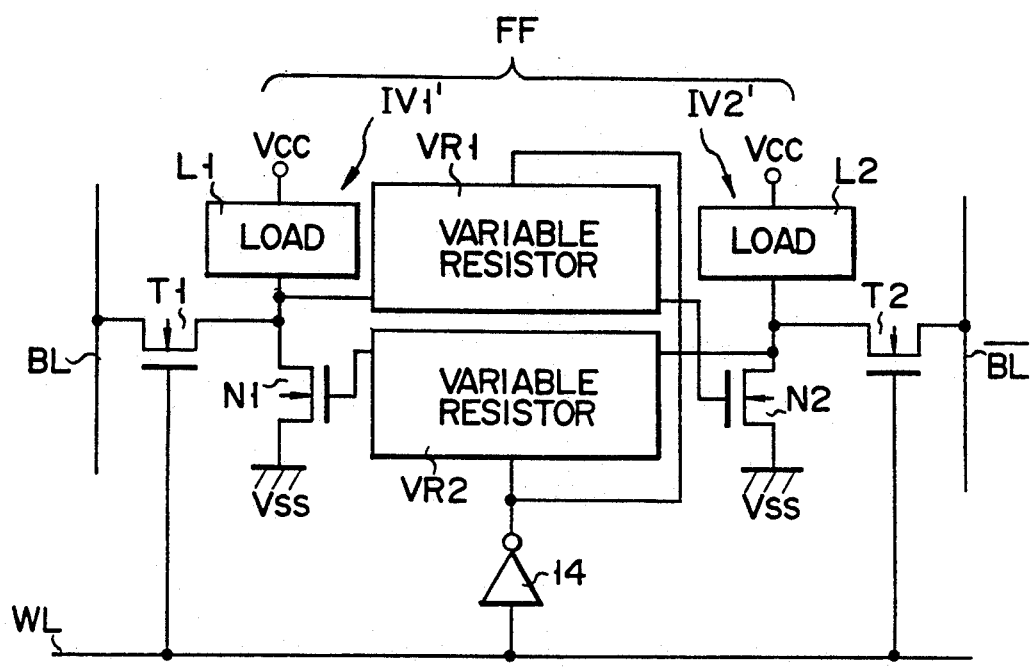
F I G. 11
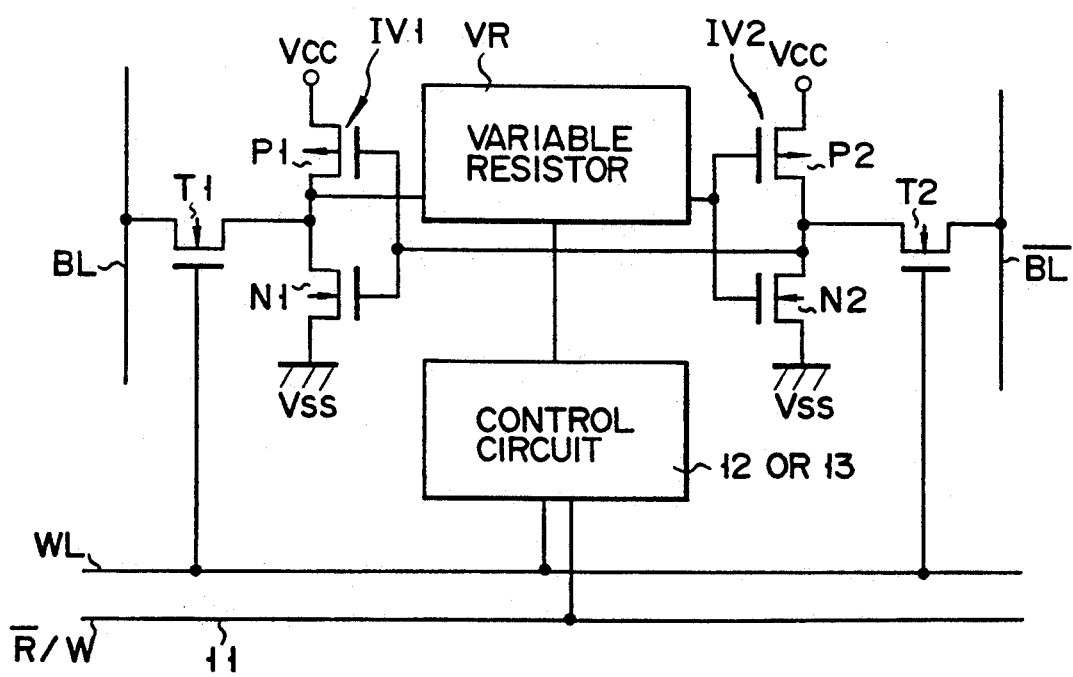
F I G. 12

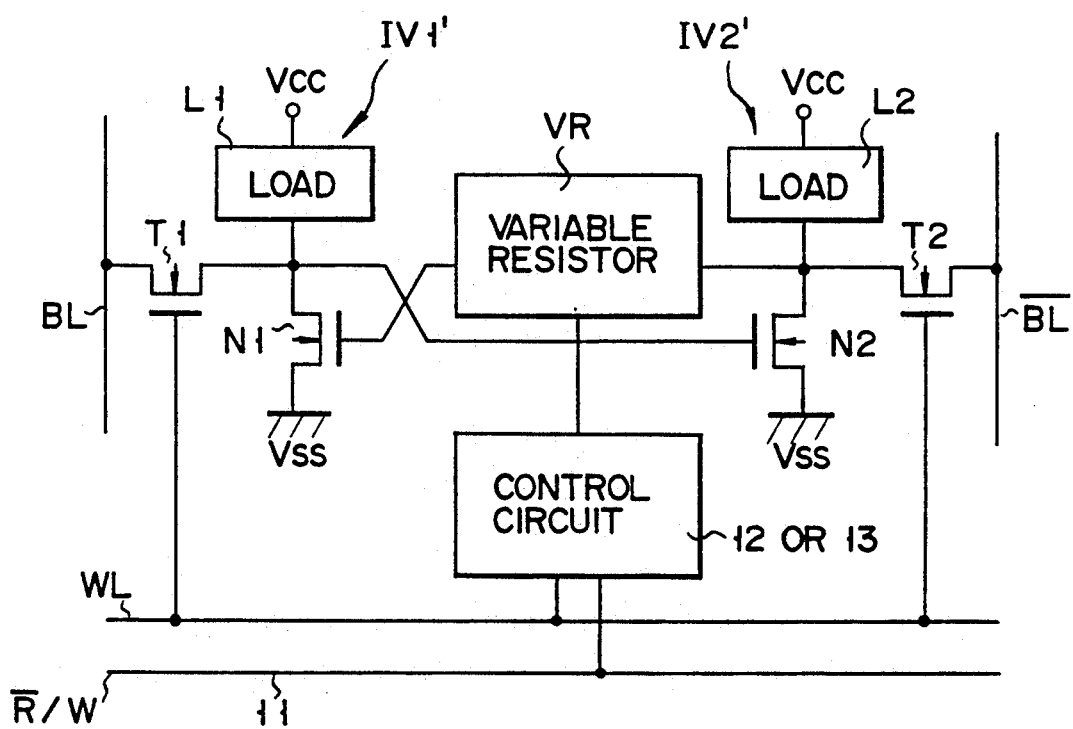
F I G. 13

MEMORY CELL OF SRAM USED IN ENVIRONMENTAL CONDITIONS OF HIGH-ENERGY PARTICLE IRRADIATION

BACKGROUND OF THE INVENTION

1. Field of the Invention

The present invention relates to a static semiconductor memory device and, more particularly, to a memory device used in environmental conditions where high-energy particle irradiation is such as found in space or in nuclear reactors.

2. Description of the Related Art

Soft errors may occur in a memory device used in severe environments such as space or nuclear reactors where high-energy particle radiation occurs. The circuit construction of a memory cell used in a static random access memory (SRAM) which can enhance the hardness to the soft error caused by irradiation of such high-energy particles is disclosed in IEEE TRANSACTIONS ON NUCLEAR SCIENCE, VOL. 36, DECEMBER 1989, pp. 2318-2322 "SEU CHARACTERIZATION OF HARDENED CMOS SRAMS USING STATISTICAL ANALYSIS OF FEEDBACK DELAY IN MEMORY CELLS" by Ross A, Kohler et al.

However, when the resistance of a feedback resistor R as shown in the above document is increased in order to enhance the hardness to the soft error, the write-in cycle time becomes long, thereby lowering the write-in speed.

SUMMARY OF THE INVENTION

Accordingly, an object of this invention is to provide a static semiconductor memory device capable of enhancing the hardness to the soft error without lowering the write-in speed.

The above object can be attained by a static semiconductor memory device comprising a first inverter; a second inverter; a first variable resistor connected between the output terminal of the first inverter and the input terminal of the second inverter; a second variable resistor connected between the output terminal of the second inverter and the input terminal of the first inverter; a first transfer transistor connected between the output terminal of the first inverter and a first bit line, the conduction state of the first transfer transistor being controlled according to a potential of a word line; a second transfer transistor connected between the output terminal of the second inverter and a second bit line, the conduction state of the second transfer transistor being controlled according to the potential of the word line; and a control circuit for controlling the first and second variable resistors to reduce the resistances of the first and second variable resistors when a memory cell is selected in the write-in cycle and controlling the first and second variable resistors to increase the resistances of the first and second variable resistors when the memory cell is not selected.

Since the first and second variable resistors provided in the memory cell are controlled by the control circuit so as to increase the resistances of the first and second variable resistors when the memory cell is not selected, the time that memory data may be inverted when high-energy particles are irradiated to the memory cell will become long. Therefore, the soft error resistance can be improved. When the memory cell is selected in the write-in cycle, the write-in cycle time is reduced and the write-in speed is enhanced since the first and second variable resistors are controlled by the control circuit so as to reduce the resistances thereof.

Thus, a static semiconductor memory device in which the soft error hardness can be enhanced without lowering the write-in speed can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7 is a circuit diagram showing a memory cell of an SRAM according to a third embodiment of this invention;

FIG. 8 is a circuit diagram showing a memory cell and a peripheral circuit of an SRAM according to a forth embodiment of this invention;

FIG. 9 is a circuit diagram showing a memory cell and a peripheral circuit of an SRAM according to a fifth embodiment of this invention;

FIG. 10 is a circuit diagram showing a memory cell of an SRAM according to a sixth embodiment of this invention;

FIG. 11 is a circuit diagram showing a memory cell and a peripheral circuit of an SRAM according to a seventh embodiment of this invention;

FIG. 12 is a circuit diagram showing a memory cell and a peripheral circuit of an SRAM according to an eighth embodiment of this invention; and FIG. 13 is a circuit diagram showing a memory cell and a peripheral circuit of an SRAM according to a ninth embodiment of this invention.

DETAILED DESCRIPTION OF THE PREFERRED EMBODIMENTS

Figure 1:
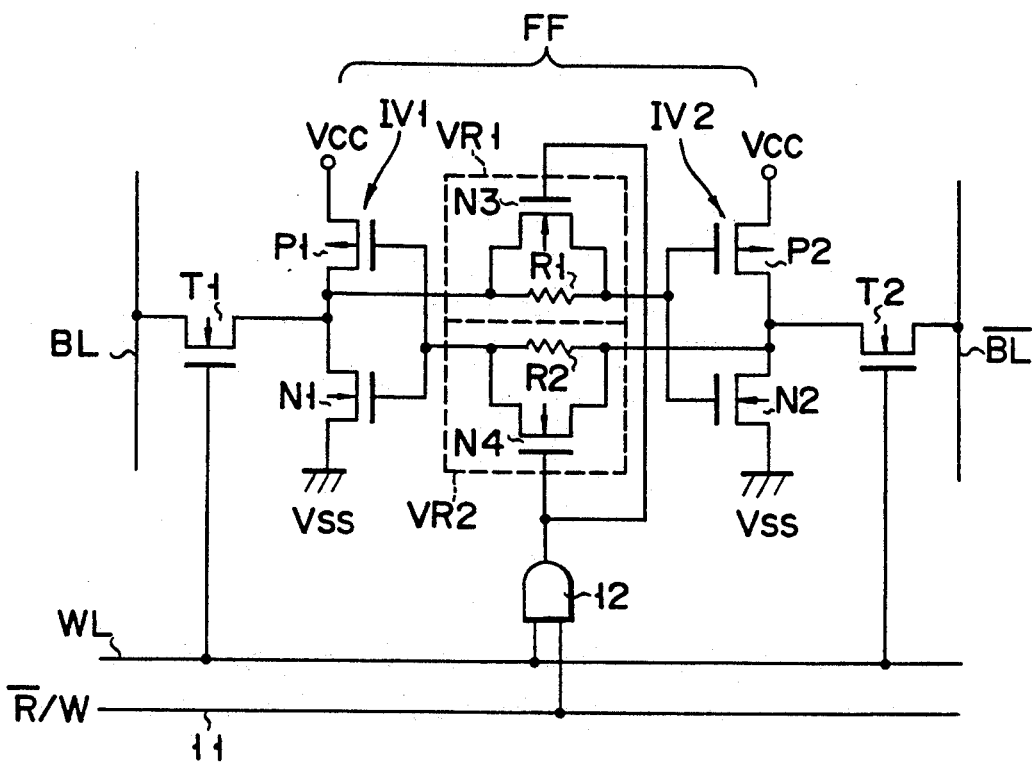
FIG. 1 is a circuit diagram showing a memory cell and a peripheral circuit of an SRAM according to a first embodiment of this invention.

FIG. 1 is a circuit diagram showing a memory cell and a peripheral circuit of an SRAM according to a first embodiment of this invention. The memory cell includes a flip-flop circuit FF and a pair of transfer gate N-channel MOS transistors T1 and T2. The flip-flop circuit FF includes a first CMOS inverter IV1 formed of a P-channel MOS transistor P1 and an N-channel MOS transistor N1; a second CMOS inverter IV2 formed of a P-channel MOS transistor P2 and an N- channel MOS transistor N2; a first variable resistor VR1 formed of a resistor R1 and an N-channel MOS transistor N3, and a second variable resistor VR2 formed of a resistor R2 and an N-channel MOS transistor N4. The transistors N3 and N4 of the first and second variable resistors VR1 and VR2 are of the enhancement type. The current path of the transistor N3 is connected in parallel with the resistor R1. The current path of the transistor N4 is connected in parallel with the resistor R2. The variable resistor VR1 is connected between an output node (which is a common connection node between the drains of the transistors P1 and N1) of the inverter IV1 and an input node (which is a common connection node between the gates of the transistors P2 and N2) of the inverter IV2. The variable resistor VR2 is connected between an output node (which is a common connection node between the drains of the transistors P2 and N2) of the inverter IV2 and an input node (which is a common connection node between the gates of the transistors P1 and N1) of the inverter IV1.

The current path of the transistor T1 is connected between the output node (first storage node) of the inverter IV1 and a bit line BL and the current path of the transistor T2 is connected between the output node (second storage node) of the inverter IV2 and a bit line $\overline{BL}$. A word line WL is connected to the gates of the transistors T1 and T2. One of the input terminals of an AND gate 12 is connected to the word line WL, and the other input terminal thereof is connected to a control line 11 and an output terminal thereof is connected to the gates of the transistors N3 and N4. The control line 11 is supplied with a control signal $\overline{R}/W$ which is set at an "H" level in the write-in cycle and at an "L" level in the readout cycle.

Although not shown in the drawing, memory cells having the same construction as the above memory cell are arranged in a matrix form to constitute a memory cell array.

Next, the operation of the memory cell with the above construction will be explained. When the memory cell (strictly speaking, memory cells arranged on the same row as the memory cell) is not selected, an output of the AND gate 12 is set to the "L" level irrespective of the level of the control signal $\overline{R}/W$ since the potential of the word line WL is set at the "L" level, thereby turning off the transistors N3 and N4. If the resistances of the resistors R1 and R2 are set to such a sufficiently large value as to enhance the soft error hardness, the time for inverting stored data becomes long even when high-energy particles are irradiated to the memory cell, that is, the data storing state can be maintained so that the soft error hardness can be enhanced. Since, in the readout cycle, the control signal $\overline{R}/W$ is set to the "L" level, an output of the AND gate 12 is set to the "L" level irrespective of the selection or non-selection of the word line WL. As a result, the transistors N3 and N4 are turned off and the resistances of the variable resistors VR1 and VR2 are set to values determined by the resistances of the resistors R1 and R2, respectively. Therefore, the possibility that memory cell data is lost by fluctuation in the bit line potential can be reduced, thereby making it possible to enhance the soft error hardness.

In contrast, in the write-in cycle, the control signal $\overline{R}/W$ is set at the "H" level, and when the memory cell is selected and the potential of the word line WL is set to the "H" level, an output of the AND gate 12 is set to the "H" level. Therefore, the transistors N3 and N4 are turned on and the resistances of the variable resistors VR1 and VR2 are respectively set to small values which are determined by the resultant resistance of the resistance of the resistor R1 and the ON-resistance of the transistor N3 and the resultant resistance of the resistance of the resistor R2 and the ON-resistance of the transistor N4. As a result, the resistances of the variable resistors VR1 and VR2 are reduced and the write-in cycle time is made shorter, thus enhancing the write-in speed.

Thus, a static semiconductor memory device in which the soft error hardness can be enhanced without lowering the write-in speed can be provided.

In the above embodiment, it is necessary to provide the control circuit (the control line 11 and the AND gate 12) in the memory cell array in order to enhance the soft error hardness without lowering the write-in speed and therefore the chip area is increased. However, an increase in the space and weight caused by an increase in the chip area is small in comparison with the case wherein a box or the like for shielding radiated high-energy particle radiation is used in order to enhance the soft error hardness. Further, the AND gate 12 may be provided for each memory cell, but the AND gate can be provided for each row of memory cells and commonly used for the memory cells on the same row so as to reduce the chip area.

Figure 2:
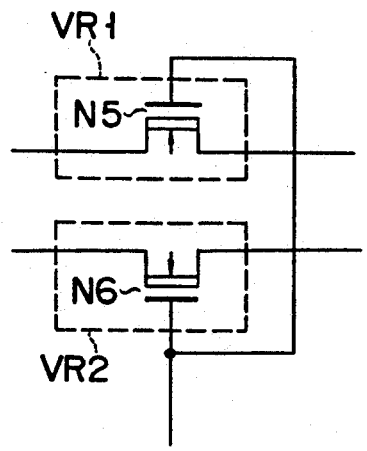
FIGS. 2 and 3 are circuit diagrams showing other examples of the construction of a variable resistor in the circuit shown in FIG. 1.
Figure 3:
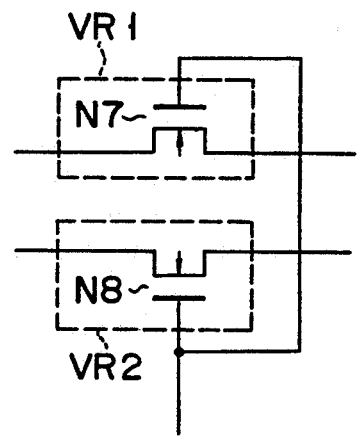

The variable resistors VR1 and VR2 are not limited to the constructions shown in FIG. 1 and may be made with different constructions. For example, a transistor which has different resistances in the ON and OFF states may be used. That is, as shown in FIG. 2, depletion type N-channel MOS transistors N5 and N6 may be used as the variable resistors VR1 and VR2 and the gates thereof may be connected to the output terminal of the AND gate 12. Further, as shown in FIG. 3, thin film transistors N7 and N8 having leak resistances of several hundred kΩ or more in the OFF state may be used and the gates thereof may be connected to the output terminal of the AND gate 12. When the variable resistors VR1 and VR2 shown in FIGS. 2 and 3 are used, the operation and effect which are substantially the same as those of the circuit shown in FIG. 1 can be obtained.

Figure 4:
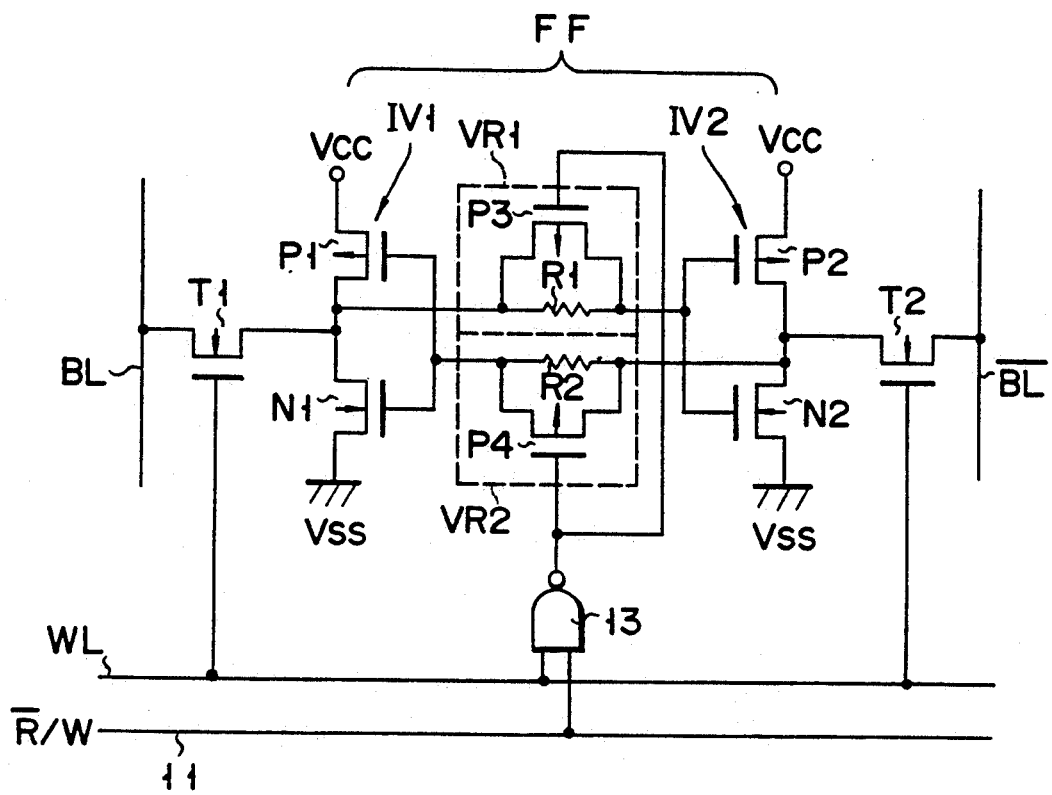
FIG. 4 is a circuit diagram showing a memory cell and a peripheral circuit of an SRAM according to a second embodiment of this invention.

FIG. 4 shows a memory cell and a peripheral circuit of an SRAM according to a second embodiment of this invention. In this memory cell, enhancement type P-channel MOS transistors P3 and P4 are used instead of the N-channel MOS transistors N3 and N4 in the circuit of FIG. 1. Further, a NAND gate 13 is used to control the conduction state of the transistors P3 and P4 instead of the AND gate 12. The other construction is the same as that of the circuit shown in FIG. 1.

With the construction shown in FIG. 4, the operation and effect which are substantially the same as those of the circuit shown in FIG. 1 can be obtained.

Further, the NAND gate 13 may be provided for each memory cell, but the NAND gate can be provided for each row of memory cells and commonly used for the memory cells on the same row so as to reduce the chip area.

Figure 5:
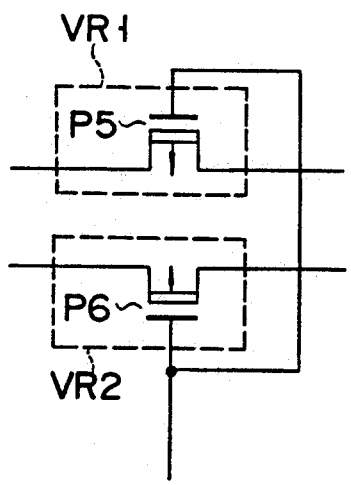
FIGS. 5 and 6 are circuit diagrams showing other examples of the construction of a variable resistor in the circuit shown in FIG. 4.
Figure 6:
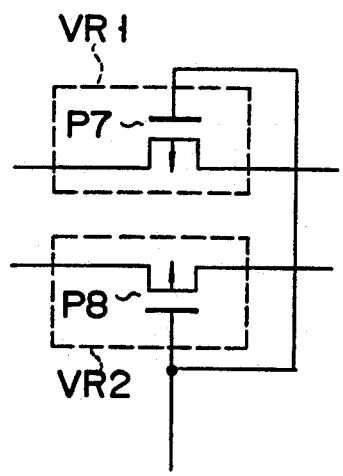

As shown in FIG. 5, depletion type P-channel MOS transistors P5 and P6 may be used as the variable resistors VR1 and VR2 in the circuit shown in FIG. 4. Further, as shown in FIG. 6, P-channel thin film transistors P7 and P8 having a leak resistance of several hundred kΩ or more can be used.

In FIG. 7, a memory cell of an SRAM according to a third embodiment of this invention is shown. In this circuit, the gates of the transistors N3 and N4 of the circuit shown in FIG. 1 are connected to the word line WL and the conduction states of the transistors are controlled only by the potential of the word line WL. Therefore, in this circuit, the control line 11 and AND gate 12 can be omitted and the number of elements and wirings can be reduced in comparison with the constructions shown in FIGS. 1 and 4. Thus, the number of elements and wirings in the construction shown in FIG. 7 can be reduced and an increase in the chip area can be suppressed to a minimum. Since the transistors N3 and N4 are turned on in the memory data readout operation and the resistances of the variable resistors VR1 and VR2 are lowered, however the soft error hardness is slightly lowered in comparison with the first and second embodiments.

In the circuit shown in FIG. 7, the variable resistors VR1 and VR2 are composed of the enhancement type N-channel MOS transistors N3 and N4 and the resistors R1 and R2. However the depletion type N-channel MOS transistors N5 and N6 may be used in the same manner as shown in FIG. 2 or the thin film transistors N7 and N8 having leak resistances of several hundred kΩ or more in the OFF state may be used in the same manner as shown in FIG. 3.

Further, as shown in FIG. 8, it is possible to construct the variable resistors VR1 and VR2 by enhancement type P-channel MOS transistors P3 and P4 and resistors R1 and R2; and invert the potential of the word line WL by use of an inverter 14; and supply the inverted potential to the gates of the transistors P3 and P4, so as to control the conduction states of the transistors P3 and P4.

In the case of the construction shown in FIG. 8, the depletion type P-channel MOS transistors P5 and P6 can be used as the variable resistors VR1 and VR2 as shown in FIG. 5. Further, as shown in FIG. 6, the P-channel type thin film transistors P7 and P8 can be used as the variable resistors VR1 and VR2.

In the above embodiments, the inverters IV1 and IV2 are each formed as a CMOS inverter, but it is also possible to use single-channel type inverters IV1' and IV2' which are respectively formed of loads L1 and L2 and switching MOS transistors N1 and N2 as shown in FIGS. 9 to 11. In this case, various elements such as resistors, depletion type MOS transistors, N-channel MOS transistors having the gates and sources thereof connected together or P-channel MOS transistors having the gates and drains thereof connected together may be used as the variable resistors VR1 and VR2. FIG. 9 shows the variable resistors VR1 and VR2 in the circuit of FIGS. 1 and 4 in block form and an AND gate 12 or NAND gate 13 as a control circuit for controlling the variable resistors VR1 and VR2 in block form. FIG. 10 shows a memory cell in which single-channel type inverters IV1' and IV2' are used instead of the CMOS inverters IV1 and IV2 in the circuit of FIG. 7, and FIG. 11 shows a memory cell in which single-channel type inverters IV1' and IV2' are used instead of the CMOS inverters IV1 and IV2 in the circuit of FIG. 8. Further, various types of variable resistors shown in FIGS. 1 to 6 may be used as the variable resistors VR1 and VR2 shown in FIGS. 9 to 11.

In the above first to seventh embodiments, the first and second variable resistors VR1 and VR2 having the same resistance are respectively connected between the output node of the first inverter IV1 (IV1') and the input node of the second inverter IV2 (IV2') and between the output node of the second inverter IV2 (IV2') and the input node of the first inverter IV1 (IV1'). However, the variable resistors VR1 and VR2 may be formed with different resistances and only one of the variable resistors may be used as shown in FIGS. 12 and 13. In the circuit of FIG. 12, CMOS inverters IV1 and IV2 acting as the first and second inverters are used, and in the circuit of FIG. 13, single-channel type inverters IV1' and IV2' are used. A combination of the N-channel MOS transistor and the resistor shown in FIG. 1, the depletion type N-channel MOS transistor shown in FIG. 2, the N-channel thin film transistor shown in FIG. 3, a combination of the P-channel MOS transistor and the resistor shown in FIG. 4, the depletion type P-channel MOS transistor shown in FIG. 5, the P-channel thin film transistor shown in FIG. 6 or the like can be used as the variable resistor VR in the circuits shown in FIGS. 12 and 13. The AND gate 12 or NAND gate 13 respectively shown in FIG. 1 or FIG. 4 may be used as a control circuit depending on the construction of the variable resistor VR. Further, the variable resistor VR may be constructed so as to be directly controlled by a potential of the word line WL or controlled by a potential obtained by inverting the above potential by use of the inverter 14 and may be constructed as shown in FIGS. 7, 8, 10, and 11.

With the construction shown in FIG. 12, an increase in the pattern area can be suppressed in comparison with the case wherein two variable resistors are used. However, the soft error hardness may be sometimes dependent on "1" or "0" of the memory data and will be lowered in comparison with a case wherein two variable resistors are used.

As described above, according to this invention, a static semiconductor memory device in which the soft error hardness can be enhanced without lowering the write-in speed can be provided.

What is claimed is:

1. A static semiconductor memory device comprising:
   first inverter means, having input and output terminals, for inverting an input signal;
   second inverter means, having input and output terminals, for inverting an input signal;
   first variable resistor means, connected between the output terminal of said first inverter means and the input terminal of said second inverter means, said first variable resistor means having a variable resistance;
   second variable resistor means, connected between the output terminal of said second inverter means and the input terminal of said first inverter means, said second variable resistor means having a variable resistance;
   first transfer means, connected between the output terminal of said first inverter means and a first bit line, said first transfer means having a conduction state controlled according to a potential of a word line;
   second transfer means, connected between the output terminal of said second inverter means and a second bit line, said second transfer means having a conduction state controlled according to the potential of said word line; and
   control means for controlling the resistances of said first and second variable resistor means to reduce the resistances of said first and second variable resistor means when a memory cell is selected in a write-in cycle and for controlling said first and second variable resistor means to increase the resistances of said first and second variable resistor means when the memory cell is not selected for the write-in cycle, said control means including a control signal line supplied with a control signal which is set at an "H" level in the write-in cycle and at an "L" level in a readout cycle and a NAND gate having one input terminal connected to said control line and another input terminal connected to said word line.

2. A device according to claim 1, wherein said first variable resistor means includes a first MOS transistor of P-channel enhancement type and a first resistor connected in parallel with a current path of said first MOS transistor, and said second variable resistor means includes a second MOS transistor of P-channel enhancement type and a second resistor connected in parallel with a current path of said second MOS transistor, and wherein gates of said first and second MOS transistors are connected to said NAND gate.

3. A device according to claim 1, wherein said first variable resistor means includes a first MOS transistor of P-channel depletion type, and said second variable resistor means includes a second MOS transistor of P-channel depletion type, and wherein gates of said first and second MOS transistors are connected to said NAND gate.

4. A device according to claim 1, wherein said first variable resistor means includes a first thin film transistor of P-channel type, and said second variable resistor means includes a second thin film transistor of P-channel type, and wherein gates of said first and second thin film transistors are connected to said NAND gate.

5. A static semiconductor memory device comprising:
first inverter means, having input and output terminals, for inverting an input signal;
second inverter means, having an input terminal connected to the output terminal of said first inverter means and an output terminal, for inverting an input signal;
variable resistor means, connected between the output terminal of said first inverter means and the input terminal of said second inverter means, said variable resistor means having a variable resistance;
first transfer means, connected between the output terminal of said first inverter means and a first bit line, said first transfer means having a conduction state controlled according to a potential of a word line;
second transfer means, connected between the output terminal of said second inverter means and a second bit line, said second transfer means having a conduction state controlled according to the potential of said word line; and
control means for controlling the resistance of said variable resistor means to reduce the resistance of said variable resistor means when a memory cell is selected in a write-in cycle and for controlling said variable resistor means to increase the resistance of said variable resistor means when the memory cell is not selected for the write-in cycle, said control means including a control signal line supplied with a control signal which is set at an "H" level in the write-in cycle and at an "L" level in a readout cycle and an AND gate having one input terminal connected to said control line and another input terminal connected to said word line.

6. A device according to claim 5, wherein said variable resistor means includes a MOS transistor of N-channel enhancement type and a resistor connected in parallel with a current path of said MOS transistor, and a gate of said MOS transistor is connected to said AND gate.

7. A device according to claim 5, wherein said variable resistor means includes a MOS transistor of N-channel depletion type, and a date of said MOS transistor is connected to said AND gate.

8. A device according to claim 5, wherein said variable resistor means includes a thin film transistor of N-channel type, and a gate of said thin film transistor is connected to said AND gate.

9. A static semiconductor memory device comprising:
first inverter means, having input and output terminals, for inverting an input signal;
second inverter means, having an input terminal connected to the output terminal of said first inverter means and an output terminal, for inverting an input signal;
variable resistor means, connected between the output terminal of said first inverter means and the input terminal of said second inverter means, said variable resistor means having a variable resistance;
first transfer means, connected between the output terminal of said first inverter means and a first bit line, said first transfer means having a conduction state controlled according to a potential of a word line;
second transfer means, connected between the output terminal of said second inverter means and a second bit line, said second transfer means having a conduction state controlled according to the potential of said word line; and
control means for controlling the resistance of said variable resistor means to reduce the resistance of said variable resistor means when a memory cell is selected in a write-in cycle and for controlling said variable resistor means to increase the resistance of said variable resistor means when the memory cell is not selected for the write-in cycle, said control means including a control signal line supplied with a control signal which is set at an "H" level in the write-in cycle and at an "L" level in a readout cycle and a NAND gate having one input terminal connected to said control line and another input terminal connected to said word line.

10. A device according to claim 9, wherein said variable resistor means includes a MOS transistor of P-channel enhancement type and a resistor connected in parallel with a current path of said MOS transistor, and a gate of said MOS transistor is connected to said NAND gate.

11. A device according to claim 9, wherein said variable resistor means includes a MOS transistor of P-channel depletion type, and a gate of said MOST transistor is connected to said NAND gate.

12. A device according to claim 9, wherein said variable resistor means includes a thin film transistor of P-channel type, and a gate of said thin film transistor is connected to said NAND gate.

13. A static semiconductor memory device comprising:
- first inverter means, having input and output terminals, for inverting an input signal;
- second inverter means, having input and output terminals, for inverting an input signal;
- first variable resistor means, connected between the output terminal of said first inverter means and the input terminal of said second inverter means, said first variable resistor means having a variable resistance;
- second variable resistor means, connected between the output terminal of said second inverter means and the input terminal of said first inverter means, said second variable resistor means having a variable resistance;
- first transfer means, connected between the output terminal of said first inverter means and a first bit line, said first transfer means having a conduction state controlled according to a potential of a word line;
- second transfer means, connected between the output terminal of said second inverter means and a second bit line, said second transfer means having a conduction state controlled according to the potential of said word line; and
- control means for controlling the resistances of said first and second variable resistor means to reduce the resistances of said first and second variable resistor means when a memory cell is selected in a write-in cycle and for controlling said first and second variable resistor means to increase the resistances of said first and second variable resistor means when the memory cell is not selected for the write-in cycle, said control means including a control signal line supplied with a control signal which is set at an "H" level in the write-in cycle and at an "L" level in a readout cycle, and an AND gate having one input terminal connected to said control line and another input terminal connected to said word line.

14. A device according to claim 13, wherein said first variable resistor means includes a first MOS transistor of N-channel enhancement type and a first resistor connected in parallel with a current path of said first MOS transistor, and said second variable resistor means includes a second MOS transistor of N-channel enhancement type and a second resistor connected in parallel with a current path of said second MOS transistor, and wherein gates of said first and second MOS transistors are connected to said AND gate.

15. A device according to claim 13, wherein said first variable resistor means includes a first MOS transistor of N-channel depletion type, and said second variable resistor means includes a second MOS transistor of N-channel depletion type, and wherein gates of said first and second MOS transistors are connected to said AND gate.

16. A device according to claim 13, wherein said first variable resistor means includes a first thin film transistor of N-channel type, and said second variable resistor means includes a second thin film transistor of N-channel type, and wherein gates of said first and second thin film transistors are connected to said AND gate.

* * * * *

UNITED STATES PATENT AND TRADEMARK OFFICE
CERTIFICATE OF CORRECTION

PATENT NO. : 5,301,146
DATED : April 05, 1994
INVENTOR(S) : Kaoru Hama

It is certified that error appears in the above-indentified patent and that said Letters Patent is hereby corrected as shown below:

Claim 7, column 8, line 13, change "date" to --gate--.

Claim 11, column 8, line 63, change "most" to --mos--.

Signed and Sealed this

Twenty-seventh Day of December, 1994

Attest:

BRUCE LEHMAN

*Attesting Officer*   *Commissioner of Patents and Trademarks*